United States Patent
Nnaji (10) Patent No.: US 8,533,656 B1
(45) Date of Patent: Sep. 10, 2013

(54) SORTED DATA OUTLIER IDENTIFICATION

(71) Applicant: Marvell International Ltd., Hamilton (BM)

(72) Inventor: Bede C Nnaji, Greeley, CO (US)

(73) Assignee: Marvell International Ltd., Hamiton (BM)

( * ) Notice: Subject to any disclaimer, the term of this patent is extended or adjusted under 35 U.S.C. 154(b) by 0 days.

(21) Appl. No.: 13/790,298

(22) Filed: Mar. 8, 2013

Related U.S. Application Data (60) Continuation of application No. 13/274,520, filed on Oct. 17, 2011, now Pat. No. 8,397,202, which is a division of application No. 12/275,024, filed on Nov. 20, 2008, now Pat. No. 8,042,073.

(60) Provisional application No. 60/990,803, filed on Nov. 28, 2007.

(51) Int. Cl.
*G06F 17/50* (2006.01)

(52) U.S. Cl.
USPC ............................ 716/136; 716/111; 714/724

(58) Field of Classification Search
USPC .................................. 716/111, 136; 714/724
See application file for complete search history.

(56) References Cited

U.S. PATENT DOCUMENTS

| | | | |
|---|---|---|---|
| 5,121,338 A | 6/1992 | Lodder | |
| 5,124,932 A | 6/1992 | Lodder | |
| 5,435,309 A | 7/1995 | Thomas et al. | |
| 5,442,562 A | 8/1995 | Hopkins et al. | |
| 6,430,430 B1 | 8/2002 | Gosche | |
| 6,807,655 B1 | 10/2004 | Rehani et al. | |
| 7,062,415 B2 * | 6/2006 | Whitefield et al. | 702/194 |
| 7,079,963 B2 | 7/2006 | Gloor et al. | |
| 7,225,103 B2 * | 5/2007 | Beresniewicz et al. | 702/179 |
| 7,356,430 B2 * | 4/2008 | Miguelanez et al. | 702/108 |
| 7,617,427 B2 | 11/2009 | Haehn et al. | |
| 7,676,468 B2 | 3/2010 | Macgregor | |
| 7,711,492 B2 | 5/2010 | Staudt et al. | |
| 7,736,905 B2 | 6/2010 | Roder et al. | |
| 8,041,597 B2 | 10/2011 | Li et al. | |
| 2003/0055523 A1 | 3/2003 | Bunkofske et al. | |
| 2003/0074169 A1 | 4/2003 | Vanderwiel | |
| 2003/0226098 A1 * | 12/2003 | Weng | 714/798 |
| 2004/0143403 A1 | 7/2004 | Brandon et al. | |
| 2005/0234688 A1 | 10/2005 | Pinto et al. | |
| 2005/0255467 A1 | 11/2005 | Adorjan et al. | |
| 2005/0278597 A1 * | 12/2005 | Miguelanez et al. | 714/738 |
| 2006/0015291 A1 | 1/2006 | Parks et al. | |
| 2006/0161403 A1 | 7/2006 | Jiang et al. | |
| 2007/0092917 A1 | 4/2007 | Guyon | |
| 2007/0136023 A1 * | 6/2007 | Schoenborn et al. | 702/117 |
| 2007/0136115 A1 | 6/2007 | Senturk Doganaksoy et al. | |
| 2007/0162803 A1 | 7/2007 | Dervisoglu et al. | |
| 2008/0082195 A1 | 4/2008 | Samardzija | |
| 2008/0082304 A1 | 4/2008 | Miller | |
| 2008/0168339 A1 * | 7/2008 | Hudson et al. | 714/800 |
| 2009/0215042 A1 | 8/2009 | Sella-Tavor et al. | |

* cited by examiner

*Primary Examiner* — Naum Levin (57) ABSTRACT

Systems and methods for performing a signature analysis on sorted data to identify one or more outliers in a dataset. The method includes determining, with a control platform, a percentile range of a sorted dataset, wherein the percentile range includes a first plurality of qualified vector patterns; determining a signature of the percentile range; determining a signature of a second plurality of vector patterns, wherein the second plurality of vector patterns includes a first test vector pattern that is outside of the percentile range; and comparing the signature of the percentile range to the signature of the second plurality of vector patterns. The method further includes, based at least in part on the comparing, identifying the first vector pattern as one of (i) a qualifying vector pattern or (ii) an outlier.

14 Claims, 8 Drawing Sheets

SORTED DATA OUTLIER IDENTIFICATION

CROSS REFERENCE TO RELATED APPLICATIONS

The present disclosure is a continuation of and claims priority to U.S. patent application Ser. No. 13/274,520, filed Oct. 17, 2011, now U.S. Pat. No. 8,397,202, issued Mar. 12, 2013, which is a divisional of and claims priority to U.S. patent application Ser. No. 12/275,024, filed on Nov. 20, 2008, now U.S. Pat. No. 8,042,073, issued Oct. 18, 2011, which claims priority under U.S.C. §119(e) to U.S. Provisional Patent Application No. 60/990,803, filed on Nov. 28, 2007, which are incorporated herein by reference.

FIELD

Embodiments of the present disclosure relate to the field of data analysis, and more particularly, to a sorted data outlier identification process.

BACKGROUND

IDDQ refers to the quiescent current that flows into a device under test (DUT) with no signals switching and without there being a clear conduction path between power (VDD) and ground (GND). IDDQ may be used as a test metric to determine the acceptability of the DUT.

The effectiveness of IDDQ tests in older processes has been well documented. However, there are some emerging issues with the use of IDDQ tests on devices developed using deeper submicron (DSM) processes. Some of these emerging issues relate to increased IDDQ leakage current as well as increased variability in the IDDQ test data. These issues may complicate differentiating between defective and non-defective devices at the DSM level using conventional data analysis procedures.

SUMMARY

Embodiments of the present disclosure describe a method of sorting a dataset, e.g., a univariate dataset, by order of magnitude, e.g., in ascending order; determining a percentile range of the dataset, the percentile range including a first plurality of qualified data points; determining a signature of the percentile range; determining a signature of a second plurality of data points of the dataset that includes a first test data point that is outside of the percentile range; comparing the signature of the percentile range to the signature of the second plurality of data points; and identifying the first test data point as a qualifying data point or an outlier based at least in part on said comparing.

The phrase "signature of the percentile range" or signature of percentile range" used above or in any of these embodiments indicates the signature of qualified data points within the said percentile range.

In some embodiments, the method may further include determining a sorted data signature analysis constant (SDSA_K); and identifying the first test data point as a qualifying data point or an outlier based at least in part on the SDSA_K.

In some embodiments, the method may identify the first test data point as a qualifying data point; re-determine the percentile range of the dataset to include the first test data point; and re-determine the signature of the percentile range.

In some embodiments, the method may further include determining a signature of a third plurality of data points that includes a second test data point that is outside of the re-determined percentile range; comparing the re-determined signature to the signature of the third plurality of data points; and identifying the second test data point as a qualifying data point or an outlier based at least in part on said comparing of the re-determined signature to the signature of the third plurality of data points.

In some embodiments, the signature of the percentile range may be determined by determining an average slope relationship between adjacent data points of the first plurality of qualified data points.

Embodiments of the present disclosure may further describe a method including determining a percentile range of a sorted dataset, the percentile range including a first plurality of qualified vector patterns; determining a signature of the percentile range; determining a signature of a second plurality of vector patterns that includes a first test vector pattern that is outside of the percentile range; comparing the signature of the percentile range to the signature of the second plurality of vector patterns; and identifying the first vector pattern as a qualifying vector pattern or an outlier based at least in part on said comparing.

In some embodiments, the method may further include receiving a third plurality of IDDQ measurements from a device under test; acquiring the dataset based at least in part on the third plurality of IDDQ measurements; and sorting the dataset by order of magnitude. The dataset may be acquired by setting each vector pattern of the dataset equal to a lesser absolute value of a left IDDQ differential and a right IDDQ differential.

In some embodiments, the method may further include determining a nearest pattern smallest delta constant (NPSD_K); and identifying the first vector pattern as a qualifying vector pattern or an outlier based at least in part on the NPSD_K.

In some embodiments, the method may include identifying the first vector pattern as a qualifying vector pattern, redetermining the percentile range of the sorted dataset to include the first vector pattern; and redetermining the signature of the percentile range. These embodiments may further include determining a signature of a third plurality of vector patterns that includes a second vector pattern that is outside of the re-determined percentile range; comparing the re-determined signature to the signature of the third plurality of vector patterns; and identifying the second vector pattern as a qualifying vector pattern or an outlier based at least in part on said comparing of the re-determined signature to the signature of the third plurality of vector patterns.

Embodiments of the present disclosure may further describe a method including identifying a plurality of qualified dies on a wafer; determining one or more neighbor differentials for each of the qualified dies; setting a value for each of the plurality of qualified dies equal to a smallest absolute value of its one or more neighbor differentials; and identifying outliers among the set values for each of the plurality of qualified dies.

In some embodiments, identifying outliers may include sorting the values by order of magnitude; determining a signature of a percentile range of the sorted values, the percentile range including a number of qualified values; determining a signature of a set of values that includes a first value that is outside of the percentile range; comparing the signature of the percentile range to the signature of the set of values; and identifying the first value as a qualifying value or an outlier based at least in part on said comparing.

In some embodiments, the method may further include determining that defect signature is bidirectional; determining that each of one or more values is associated with a negative neighbor differential; and setting each of the one or more values equal to its respective negative neighbor differential.

Embodiments of the present disclosure may further describe a system including a testing platform having an interface communicatively coupled to a device interconnect, which is configured to be communicatively coupled to a device; and a control platform communicatively coupled to the interface and configured to receive a plurality of IDDQ measurements from the device, generate a sorted dataset, having a plurality of vector patterns, based at least in part on the IDDQ measurements, dynamically generate a qualified signature of a percentile range of the sorted dataset, and identify outliers among the plurality of vector patterns based at least in part on the qualified signature.

In some embodiments, the control platform may be further configured to identify one or more qualified vector patterns; update the percentile range to include the one or more qualified vector patterns; and regenerate the qualified signature based at least in part on the updated percentile range.

In some embodiments, the control platform may be further configured to determine an NPSD_K; and identify an outlier based at least in part on the NPSD_K.

In some embodiments, the control platform may be further configured to determine the NPSD_K based at least in part on the plurality of vector patterns.

Other embodiments may also be described and claimed.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrases "A/B" and "A and/or B" mean (A), (B), or (A and B). For the purposes of the present invention, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of this disclosure include a sorted data signature analysis (SDSA) for identifying outliers in a given dataset. The SDSA outlier identification procedures may be utilized in a nearest pattern smallest delta (NPSD) procedure to identify IDDQ defects of a device under test (DUT), as well as in a nearest neighbors smallest delta (NNSD) procedure for a wafer-level test process.

Figure 1:
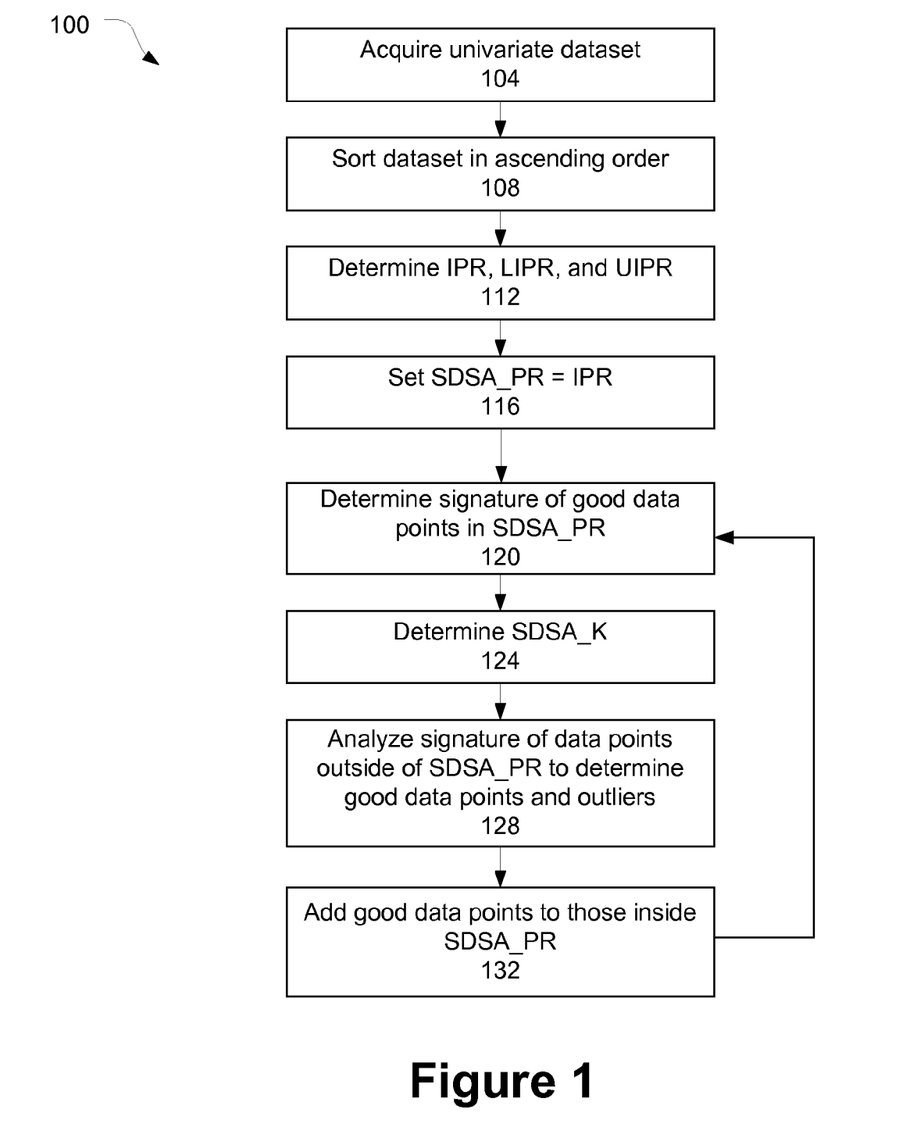
FIG. 1 is a flowchart illustrating a sorted data signature analysis (SDSA) outlier identification procedure in accordance with various embodiments.

FIG. 1 is a flowchart 100 illustrating an SDSA outlier identification procedure (hereinafter "SDSA procedure") in accordance with some embodiments. At block 104, a univariate dataset, e.g., a dataset with a single variable, may be acquired. In cases in which a multivariate dataset is originally acquired, it may be subsequently reduced to a plurality of univariate datasets with each dataset being subjected to the SDSA procedure.

At block 108, the dataset may be sorted by order of magnitude, e.g., arranged in ascending or descending order. The datasets discussed herein are sorted in ascending order; however, other embodiments may sort the datasets in descending order with appropriate procedural modifications being made.

At block 112, an inter-percentile range (IPR), a lower IPR (LIPR), and an upper IPR (UIPR) of the dataset may be determined. An IPR may be a range of data points within the sorted dataset that indicates, with a high degree of certainty, qualified data points. The LIPR and UIPR may be lower and upper boundaries of the IPR.

A qualified data point, as used herein, is a data point that represents a measurement or observation that is deemed, e.g., through the SDSA procedure, to be properly associated with the remaining qualified data points of a particular dataset. A qualified data point may also be referred to as a good data point. An outlier, as used herein, may be a non-qualified data point.

At block 116, an SDSA percentile range (SDSA_PR) may be set equal to the IPR. Unlike the IPR, the SDSA_PR may be a variable range of the dataset that continues to change based at least in part on the number of data points that are determined to be qualified data points.

The SDSA_PR may be used to determine a signature of the qualified data points at block 120. A signature, as used herein, may be an average slope relationship between adjacent data points of a given set of data. The signature of the qualified data points, or the "qualified signature," may be used in setting a limit for differentiating between qualified data points and outliers.

The first instance of the qualified signature may be the signature of the sorted data points inside the IPR. Subsequent qualified signatures may differ as the SDSA_PR differs from the IPR.

At block 124, an SDSA_K may be determined. The SDSA_K may be a variable used in determining the limits used to identify an outlier signature within the dataset. The SDSA_K may be set at a value that would not lead to cases of false outlier identification or cases of true outliers escaping detection. The SDSA_K may be thoroughly evaluated and adjusted in order to provide these two conditions. In some embodiments, the SDSA_K may be set to an initial default value and then updated based on the qualified data points within the SDSA_PR.

At block 128, the signatures of the sorted data points outside of the SDSA_PR may be determined and analyzed to identify qualified data points and outliers. This analysis may be performed using an SDSA algorithm discussed in more detail with respect to FIG. 3. The signature of the tested data point may be compared to the SDSA_PR signature.

The signature of the qualified data points outside of the SDSA_PR may be expected to be similar to the qualified signature and, conversely, the signature of the outliers may be expected to be dissimilar to the qualified signature. The SDSA_K may be the value that determines whether a tested signature is similar or dissimilar to the qualified signature. Thus, the comparison of the qualified signature to the tested signature, to determine whether the tested signature is a qualified signature or an outlier signature, may be based at least in part on the SDSA_K as will be explained in further detail below.

At block 132, qualified data points identified through said signature analysis at block 128 may be added to the SDSA_PR and the procedure may loop back to block 120 to update variables and proceed to analyze additional data points.

In this manner, the SDSA_PR may be iteratively expanded to accommodate the qualified data points without including the outliers. Therefore, once a data point is determined to be a qualified data point it is added to the SDSA_PR and used to evaluate the next data point in the dataset.

In some embodiments, the procedure may test for outlier behavior by sequentially evaluating all data points above the UIPR and all data points below the LIPR. It may be noted that data points inside the IPR may not be evaluated for outlier signature because they are assumed to be qualified data points.

If the data sweep is from UIPR up to failing data point, e.g., an outlier, the failing data point and all data points above it may be classified as outliers. If the data sweep is from LIPR down to a failing data point, the failing data point and all data points below it may be classified as outliers.

In some embodiments, an iterative outlier analysis of data points above the UIPR, e.g., analysis of a $j^{th}$ data point of the sorted dataset with j>UIPR, may be explained as follows.

A sorted data differential total (SDDT) may be the sum of data points differential, e.g., difference between adjacent data points, within a specified range of a dataset. This may be represented by the following equation:

$$SDDT = \left( \sum_{i=LIPR}^{j-2} (SDSA[i+1] - SDSA[i]) \right). \qquad \text{Eq. 1}$$

The SDSA_PR may be expressed, with relation to the LIPR and the UIPR as:

$$SDSA\_PR = (UIPR - LIPR) + (j - UIPR - 1). \qquad \text{Eq. 2}$$

A sorted data differential average (SDDA) may be the average value of data points differential within a specified range of dataset. This may be represented by the following equation:

$$SDDA = SDDT/SDSA\_PR. \qquad \text{Eq. 3}$$

An outlier analysis condition may be expressed by:

$$SDSA[j] - SDSA[j-1] < (SDDA * m * SDSA\_K) + SDSA\_LSL, \qquad \text{Eq. 4}$$

where $$m = SDSA\_PR + 1, \qquad \text{Eq. 5}$$

and SDSA_LSL is the lowest limit set for the SDSA.

If the outlier analysis condition holds true, then the $j^{th}$ data point may be considered a qualified data point. If it is false, the $j^{th}$ data point may be considered an outlier.

Similarly, in some embodiments, an iterative outlier analysis of data points below the LIPR, e.g., analysis of a $i^{th}$ data point of the sorted dataset with i<LIPR, may be explained as follows.

The SDDT may be represented by the following equation:

$$SDDT = \left( \sum_{j=i+1}^{UIPR-1} (SDSA[j+1] - SDSA[j]) \right). \qquad \text{Eq. 6}$$

The SDSA_PR may be expressed, with relation to the LIPR and the UIPR as:

$$SDSA\_PR = (UIPR - LIPR) + (LIPR - i - 1). \qquad \text{Eq. 7}$$

The SDDA may be represented by equation 3, above, and an outlier analysis condition may be expressed by:

$$SDSA[i+1] - SDSA[i] < (SDDA * n * SDSA\_K) + SDSA\_LSL, \qquad \text{Eq. 8}$$

where $$n = SDSA\_PR + 1. \qquad \text{Eq. 9}$$

If the outlier analysis condition holds true, then the $i^{th}$ data point may be considered a qualified data point. Otherwise, the $i^{th}$ data point may be considered an outlier.

In some embodiments, the dataset may be analyzed a plurality of times to determine if there are outliers within the dataset.

Figure 2:
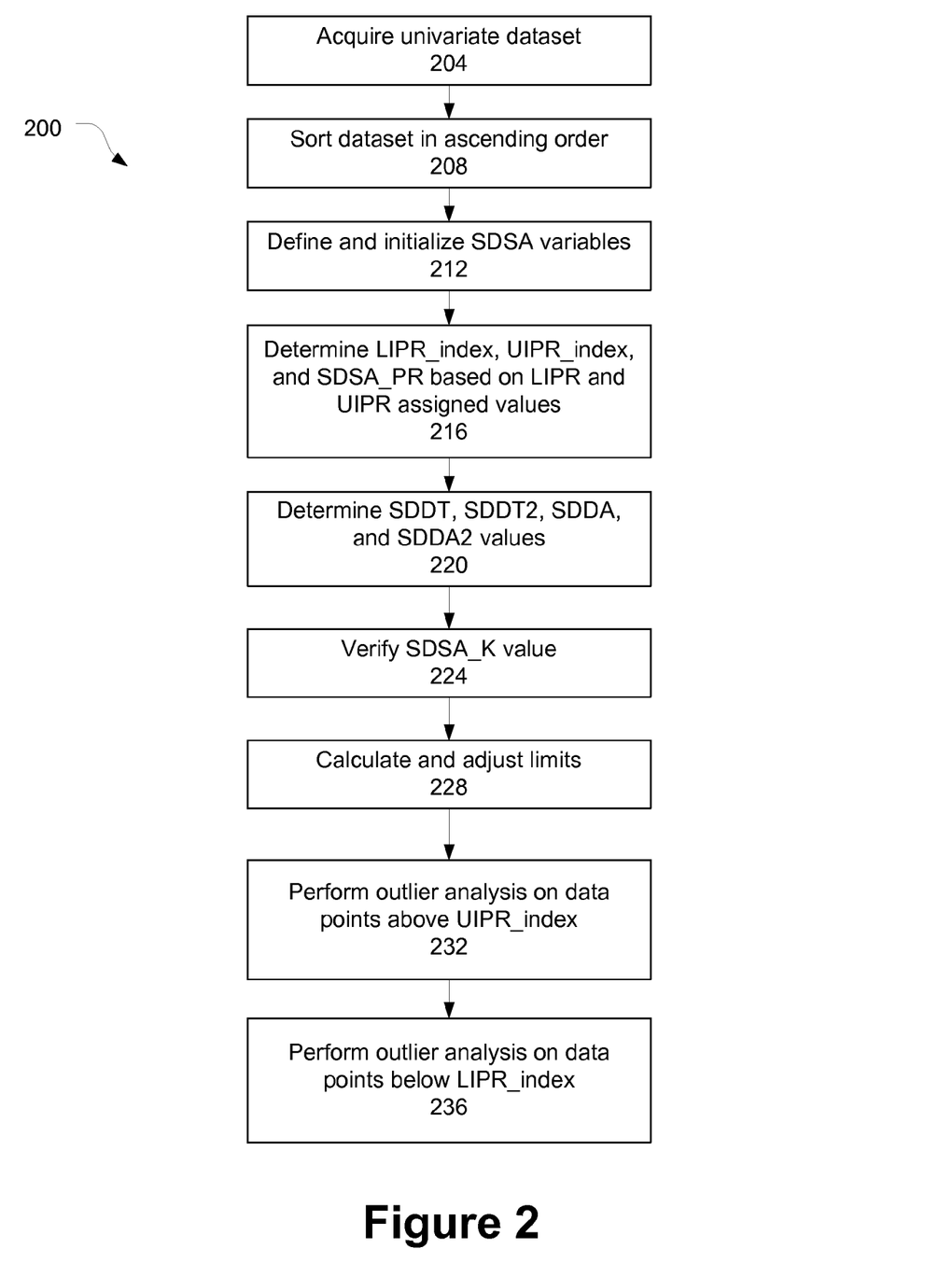
FIG. 2 is a flowchart illustrating another SDSA outlier identification procedure in accordance with various embodiments.

FIG. 2 is a flowchart 200 illustrating an SDSA procedure in additional detail in accordance with some embodiments.

At block 204, a univariate dataset may be acquired, similar to block 104 discussed above.

At block 208, the dataset may be sorted by order of magnitude, e.g., in ascending order, SDSA [0, ..., n−1], where n is the total number of data points in the dataset.

At block 212, SDSA variables may be defined and initialized. In some embodiments, the following definitions and conditions may be established:

TABLE 1

```
int LIPR=40, UIPR=60, SDSA_PR; ## LIPR >= 0; UIPR < 100;
int LIPR_index, UIPR_index, iteration_counter;
double SDSA_K=1, SDSA_LSL=0;
double SDDA=0, SDDA2=0, SDDT=0, SDDT2=0, SDSA_DL, K_EVAL;
double SDSA_DD, SDSA_DD1, SDSA_DD2;
doethie dyn_limits_chker=0.25, dyn_limits_buf=0.25, extra_limits_buf=0.2;
const double iteration_factor=0.01, iteration_factor2=0.05;
```

The specific variable types used in Table 1, e.g., int, double, and const double, are illustrative of variable types that may be used for a particular embodiment. It will be understood that other variable types may be used in other embodiments.

SDSA_DD may be SDSA differential data, e.g., the difference between adjacent data points. As discussed below, the SDSA_DD1 may be used for testing data points below the LIPR_index while SDSA_DD2 may be used for testing data points above the UIPR_index.

In some embodiments, the initial values may be overridden, if needed, from command line inputs or other assignments.

At block 216, the values of LIPR_index, UIPR index, and SDSA_PR may be determined based at least in part on the LIPR and UIPR values assigned at block 212. In some embodiments, the determination of these values may be provided by the following equations:

$$LIPR\_index = (int)((LIPR*n)/100); \quad \text{Eq. 10}$$

$$UIPR\_index = (int)(UIPR*n)/100); \quad \text{Eq. 11}$$

$$SDSA\_PR = UIPR\_index - LIPR\_index. \quad \text{Eq. 12}$$

At block 220, the values of SDDT, SDDT2, SDDA, and SDDA2 may be determined. In some embodiments, these values may be determined by the algorithm of the following table.

TABLE 2

```
for (index=LIPR_index; index<UIPR_index; index++)
{
    SDDT = SDSA[index+1] - SDSA[index] + SDDT;
}
switch (SDDT) {case 0 : printf("ERROM\n"); SDDT += 1e-06;}
SDDA = SDDT / SDSA_PR;
SDDA2 = SDDA;
SDDT2 = SDDT;
```

It may be noted that a value of zero for the SDDT may be an indication of improper implementation of this procedure and/or improper overall setup. In the event that SDDT does equal zero, line four of Table 2 may cause an error statement to be output and the SDDT to be set equal to a small number.

At block 224, the value of SDSA_K, which may have an initial default value of one, may be verified by determining that it does not lead to false failures and/or test escapes. Since the setup is such that the data points inside the IPR are to be qualified data points, it may be that the data points just outside the IPR should also be qualified data points. Accordingly, in verifying the SDSA_K, the data point just above the UIPR_index and the data point just below the LIPR_index may be checked to see if either is identified as an outlier, or even identified as being close to an outlier. If so, the value of the SDSA_K may be automatically adjusted.

In checking the data points above and below the IPR, the SDSA_DD, which at this stage has the value of the data differential just above the UIPR_index or just below the LIPR_index, may not be identified as an outlier by the first SDSA_K. Knowing the smallest SDSA_K value that would lead to a first data point evaluated being identified as an outlier may assist in the setting of the initial value of SDSA_K.

In some embodiments, a smallest value of SDSA_K that would lead to a failure on the first SDSA_DD evaluated may by determined through the calculation and evaluation of SDSA limits at block 228. The first SDSA limit may be an SDSA delta limit (SDSA_DL), which may be the signature of all good data points within the SDSA_PR. The SDSA_DL may be calculated and evaluated by the algorithm section depicted in the following table.

TABLE 3

```
SDSA_DL = (SDDT * SDSA_K);
K_EVAL = SDSA_K;
SDSA_DD1= SDSA[LIPR_index] - SDSA[LIPR_index-1];
SDSA_DD2 = SDSA[UIPR_index+1] - SDSA[UIPR_index];
SDSA_DD = SDSA_DD1 >= SDSA_DD2 ? SDSA_DD1 : SDSA_DD2;
while (SDSA_DL > SDSA_DD) {
    K_EVAL = K_EVAL - iteration factor; //iteration_factors
    recommended range (0.01.. 0.1)
    SDSA_DL = (SDDT * K_EVAL);
    if (K_EVAL < 0) {K_EVAL = 0;}
}
SDSA_K = SDSA_K + K_EVAL;
SDSA_DL = (SDDT * SDSA_K);
```

A constant evaluator, K_EVAL, may be a variable used in evaluating and adjusting the value of SDSA_K.

Since SDSA_DD is always greater than or equal to zero, K_EVAL at this point may not be less than zero, hence the statement in line 9 of table 3—"if (K_EVAL<0) {K_EVAL=0}."

While the default value of one for SDSA_K may be suitable for many embodiments, some embodiments may employ other default levels dependent on the level of variance in the dataset being analyzed. This may be done by using the algorithm of table 3 to determine the final SDSA_K value through analysis of the qualified data points of the IPR.

While the algorithm of Table 3 automatically adjusts the SDSA_K value to prevent cases of false outlier identifications, other embodiments may include additional sections specifically designed to prevent outlier escapes. In one embodiment, an algorithm that both prevents cases of false outlier identifications and outlier escapes could be implemented by replacing the statement [SDSA_K=SDSA_K+K_EVAL;] above with the following statement [SDSA_K=a_derived_value+K_EVAL;], where the value of the variable, a_derived_value, is determined based on the real-time data being analyzed.

In some embodiments, when the variance in the dataset is very small, SDSA_K may be greater than one; and when the variance in the dataset is large, SDSA_K may be less than one but greater than 0. The variance, in terms of large or small, is with respect to the spread or dispersion of the dataset within the SDSA_PR.

In some embodiments, finding the desired value for SDSA_K may be done by finding out the angle of slope on the data within the IPR and, from the value of this angle, determining the desired value of SDSA_K. The equation for determining the angle of the slope (θ) within the IPR may be given as:

$$\theta = \tan^{-1}\left(\frac{y}{x}\right), \quad \text{Eq. 13}$$

where y=SDDT and x=SDSA_PR.

In some embodiments, a very small angle value may indicate low variation in the dataset. Accordingly, the SDSA_K value may be set to be greater than one. A larger angle value may indicate a larger variation in the dataset. Accordingly, for this embodiment, the SDSA_K value may be set between zero and one. The final calculated value of SDSA_K may not be less than or equal to zero.

As defined above, the value of the slope angle ($\theta$) used in determining SDSA_K in Eq. 13 is controlled by SDDT and SDSA_PR. Therefore, the type of data being analyzed and the relationship between the value of the slope angle ($\theta$) to the IPR may help to determine what slope angle ($\theta$) value should be classified as small or large slope angle.

Once the SDSA_K value is calculated, it may be determined whether there is a sufficient buffer in the limits set with the given SDSA_K value. This may be done through the algorithm embodied in the following table.

TABLE 4

K_EVAL = (SDDT * (SDSA_K – dyn_limits_buf_chker);
Iteration_counter=0;
If (K_EVAL <= 0) {
   while ((K_EVAL <= 0) && (iteration_counter < 50)) { // constant 50
   can be changed
      iteration_counter++;
      dyn_limits_buf_chker = dyn_limits_buf_chker – iteration_factor2;
      K_EVAL = (SDDT * (SDSA_K – dyn_limits_buf_chker));
   }
}

In some cases depending on the value of SDSA_K and dyn_limits_buf_chker variable, K_EVAL may become negative which could undermine the integrity of the evaluation. The algorithm of Table 4 prevents this from happening by ensuring that the final value of K_EVAL used in this evaluation is greater than zero before a conclusion is reached in the buffer evaluation process.

In some embodiments, a desired range for the dyn_limits_buf_chker variable may be 0.2 to 0.4 and the default value may be set at 0.25.

The constant 50 may be used to prevent cases of infinite loop during this evaluation and may be changed as desired.

In some embodiments, the iteration_factor variables may be relatively small in order to increase the resolution and accuracy in the algorithm iteration sequence. However, their value may always be greater than zero. In some embodiments, a desired range for the iteration_factor variables is 0.01 to 0.1.

If the K_EVAL from the buffer evaluation process shows that there will not be enough buffer in the limits with the given SDSA_K value, the setting of the SDSA_K variable may be adjusted with the algorithm of the following table.

TABLE 5 if (K_EVAL < SDSA_DD ) {
   while (SDSA_DL < SDSA_DD) {
      SDSA_K = SDSA_K + dyn_limits_buf;
      SDSA_DL = (SDDT* SDSA _K);
   }
   SDSA_K = SDSA_K + extra_limits_buf;
}
SDSA_DL = (SDDT * SDSA_K) + SDSA_LSL;

The variables dyn_limits_buf and extra_limits_buf may be variables used in adjusting the value of SDSA_K if there is a desire to add more buffer to the limits. In some embodiments, desired ranges for these variables may be 0.2 to 0.5. The default value for these two variables may be set at 0.25. Other embodiments may have different default values for each of these variables.

In this manner, the various SDSA limits may be set in preparing for an outlier analysis.

At block 232, an outlier analysis may be performed on data points above the UIPR_index. This outlier analysis may be performed by the algorithm of the following table.

TABLE 6 for (index = UIPR_index+1; index < n; index++) {
   SDSA_DD = SDSA[index] – SDSA[index–1];
   if (SDSA_DD > SDSA_DL)
      {Indicate failure; All data from SDSA[index] up to SDSA[n–1]
      becomes outliers;}
   else {
      SDSA_PR = (UIPR – LIPR) + (index – UIPR – 1);
      SDDT = SDDT + SDSA_DD;
      SDDA = SDDT / SDSA_PR;
      m = SDSA_PR +1;
      SDSA_DL = SDDA * m * SDSA_K + SDSA_LSL ;
   }
}

The algorithm of Table 6 checks all the data points located in the region higher than the UIPR_index. All the data points above the UIPR_index may be consecutively checked and when a failure, e.g., an outlier, is found, the outlier and all data points above the outlier may be identified as outliers.

At block 236, an outlier analysis may be performed on data points below the LIPR_index. This outlier analysis may be performed by the algorithm of the following table.

TABLE 7 for (index = LIPR_index–1; index => 0; index––) {
   SDSA_DD = SDSA[index+1] – SDSA[index];
   if (SDSA_DD > SDSA_DL)
      {Indicate failure; All data from SDSA[index] down to SDSA[0]
      becomes outliers; }
   else {
      SDSA_PR = (UIPR – LIPR) + (LIPR – index – 1);
      SDDT2 = SDDT2 + SDSA _DD;
      SDDA2 = SDDT2 / SDSA_PR;
      m = SDSA_PR +1;
      SDSA_DL = SDDA2 * m * SDSA_K + SDSA_LSL;
   }
}

The algorithm of Table 7 checks all the data points located in the region lower than the LIPR_index. All the data points below the LIPR_index may be consecutively checked and when an outlier is found, the outlier and all data points above the outlier may be identified as outliers.

The SDSA procedure described above may be useful for analyzing sorted data sets in a number of contexts. One context in which the adaptive capabilities of the SDSA procedure may be especially useful is in IDDQ testing of DSM devices.

Figure 3:
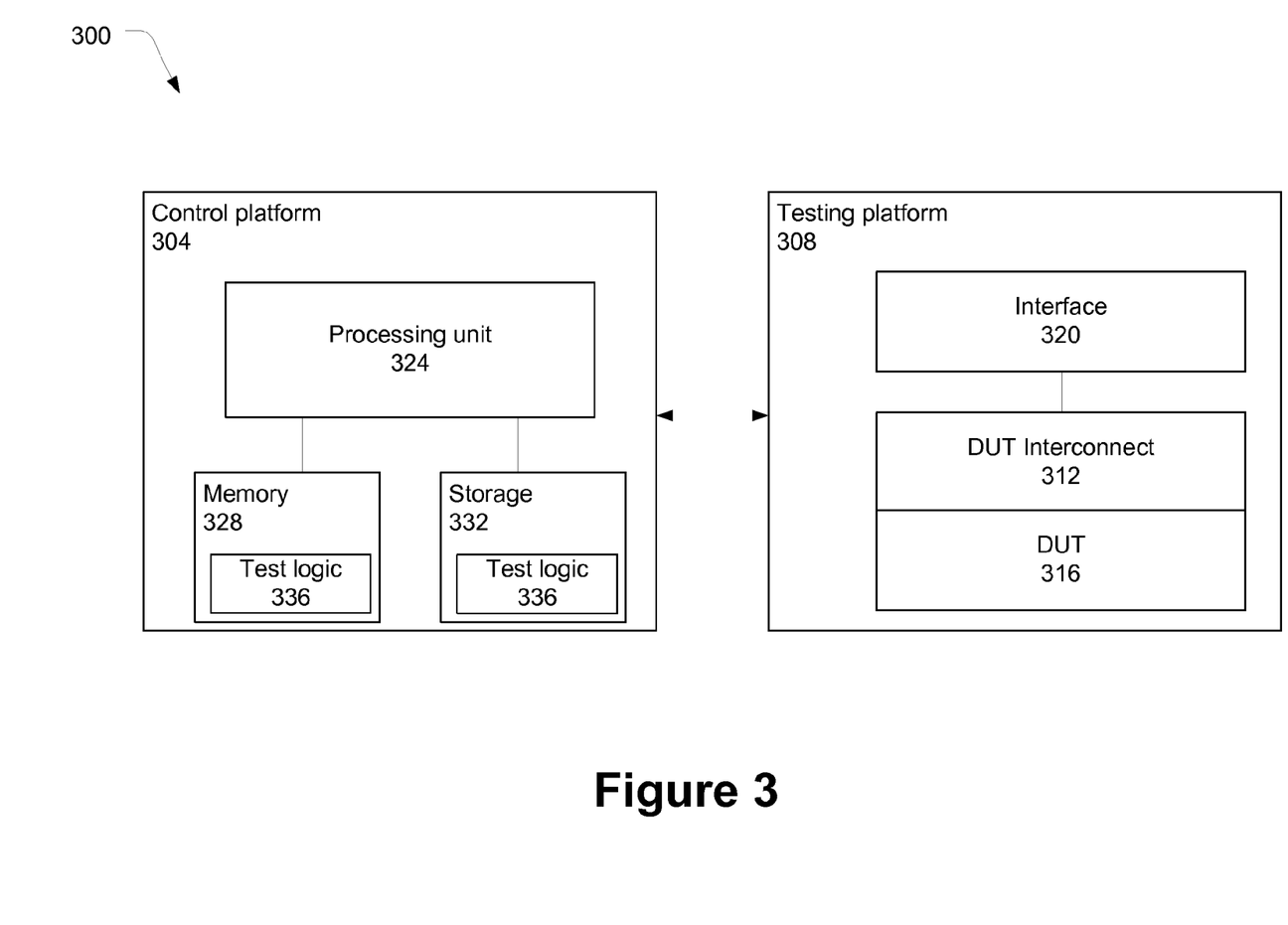
FIG. 3 is a schematic diagram of a testing system in accordance with various embodiments.

FIG. 3 is a schematic diagram of a testing system 300 in accordance with various embodiments. The testing system 300 may include a control platform 304 coupled with a testing platform 308 as generally shown.

The testing platform 308 may include a DUT interconnect 312, e.g., an interconnect board with a number of pins, that is configured to electrically couple a DUT 316 to an interface 320. The DUT 316 may be an individual die or a number of dies coupled together, e.g., a wafer prior to the die removal process. The interface 320 may be programmed, or otherwise controlled, by the control platform 304 to transmit/receive a number of signals to the DUT 316 through the DUT interconnect 312 in order to test the DUT 316.

The control platform 304 may include a processing unit 324 coupled with memory 328 and storage 332, which may include, in particular, temporal and persistent copies of test logic 336, respectively. The test logic 336 may include instructions of various processes to be executed by the processing unit 324 that cause the control platform 304 to implement one or more tests of the DUT 316, including programming of the interface 320 to collect IDDQ data from the DUT 316. The test logic 336 may also include instructions of various processes to be executed by the processing unit 324 to implement procedures/algorithms to analyze a dataset for outliers as described herein. In this particular embodiment, this analysis may be used to analyze collected IDDQ data and determine whether the DUT 316 passes or fails one or more tests. While embodiments of this disclosure may refer to a DUT passing or failing, it will be understood that various embodiments may include tests with any level of degree of acceptability in between these two determinations.

The memory 328 may include various levels of cache memory and/or main memory and may be random access memory (RAM), dynamic RAM (DRAM), static RAM (SRAM), synchronous DRAM (SDRAM), dual-data rate RAM (DDRRAM), etc.

The storage 332 may include integrated and/or peripheral storage devices, such as, but not limited to, disks and associated drives (e.g., magnetic, optical), USB storage devices and associated ports, flash memory, read-only memory (ROM), non-volatile semiconductor devices, etc.

In various embodiments, the testing system 300 may have more or less elements and/or different architectures.

As briefly discussed above, current IDDQ tests on DSM devices are experiencing a high degree of variability in the IDDQ test data. It may be that three contributory factors account for a significant portion of any variation of IDDQ data collected from such devices. These contributory factors may be variations in process, test conditions, and test instruments. While these contributory factors may have contributed, in some degree, to variability of IDDQ data of older processes, the effects are becoming more pronounced with the trend toward DSM devices. Accordingly, various embodiments of the present disclosure present IDDQ test procedures to account for these contributory factors to reduce variability of IDDQ data as well as increase the difference between qualified and outlier signatures, which may help to reliably determine defective and non-defective devices. The IDDQ methodologies discussed herein include data analysis procedures, e.g., an NPSD procedure, which may be based largely on the SDSA procedure described above, as well as IDDQ test setup procedures.

Process variation may refer to variation in the processes used in the manufacture of various devices. A lower threshold voltage of a DSM device, with respect to a device made by an older process, may result in higher IDDQ data variability. Therefore, it is difficult to set a static IDDQ limit that has the capability to consistently detect outlier signatures across processes. Accordingly, the SDSA procedures described above, with their dynamic, continuously changing limits that are based at least in part upon real-time data being analyzed and processed, may be especially useful in the IDDQ methodologies.

Variation of data collected and analyzed typically increases from die-level to product-level, e.g., die-level variations<neighbor dies variations<wafer-level variations<product-level variations. Thus, some embodiments perform the NPDS analysis at a die-level in order to increase resolution of defect detection. These efforts work to reduce the IDDQ variability due to process variation.

Variations due to test condition include those contributed by test setups and the nature of the test. For example, variation may occur through effects of temperature changes, which may be mostly contributed by data scan in/out process. Variation may also occur through vector setup such as settling time needed before making IDDQ measurement. For each vector pattern, which may be an NPSD data point as described below, settling time may be set such that current measurements are not made during the charging and discharging time zone of the bypass capacitors or other capacitance that might be added by components of the test instruments. This may be addressed in both vector and test-flow setup.

Another example of test conditions leading to variations include issues relating to dual mode current signature, e.g., an instance where a device exhibits two IDDQ current states that are both quiescent. This may be resolved by selectively picking and combining vector patterns with similar current signature.

Voltage and frequency used for data scanning (e.g., transmitting signals to and/or receiving signals from the interface 320) and/or for current measurement may also contribute to variations. For example, clock frequency used during test and voltage test points may affect the final value of IDDQ current measured during the IDDQ test. Running the IDDQ test at higher clock speed could heat up the part faster, thereby elevating the IDDQ current measured. Also, using higher voltage during IDDQ test may also elevate the measured IDDQ current. Therefore, a setup may created to allow you to scan data to state the part at a different frequency and voltage but make the IDDQ current measurement at a different voltage and/or frequency. This may provide benefits such as reducing negative effects on measured current due to clock frequencies and bias voltages and may also improve the resolution of the defect detection process.

Some of these test condition sources of variation, e.g., temperature, may be addressed by the dynamic nature of the IDDQ limit of an NPSD procedure, to be explained in further detail below. For example, while temperature changes may cause the IDDQ data to drift, the IDDQ limit may be responsive enough to account for this drift. Other of these sources of variation may be addressed through proper test setup. For example, a proper test setup may include these qualities: test is stable with the results being repeatable under the same test conditions; IDDQ current difference between the min and max IDDQ current in any vector label may be very low, e.g., a target of about 250 microamps (uA) for a 100 pattern vector; coverage numbers, e.g., the percentage of vector patterns covered by a particular vector, may be considered with respect to the number of vector patterns utilized; etc.

Variations of test instruments of the testing platform 308 may also contribute to IDDQ data variability. For example, different testing platforms may include different power supply noise, accuracy, stability, dynamic range, resolution, etc. Measuring instruments with a high resolution of measuring accuracy may facilitate detection of small deviations in the current signature. In some embodiments, it may be possible to increase resolution of the measuring instrument by taking multiple measurements on each strobe point and then averaging out the multiple measurements at each strobe.

Cumulative effects of these contributory factors may mask defect current components in an IDDQ current measurement, which may be used to detect passive defects. Embodiments of the present disclosure describe how to distinguish the signatures of these contributory factors from true IDDQ passive defect current, thereby allowing them to be targeted and neutralized, or otherwise reduced, in order to increase the resolution of passive defects detection in DSM devices. Furthermore, some disclosed embodiments may not only reduce the effects of the contributory factors but also magnify the differences between qualified and outlier signatures so that they become statistically significant.

Figure 4:
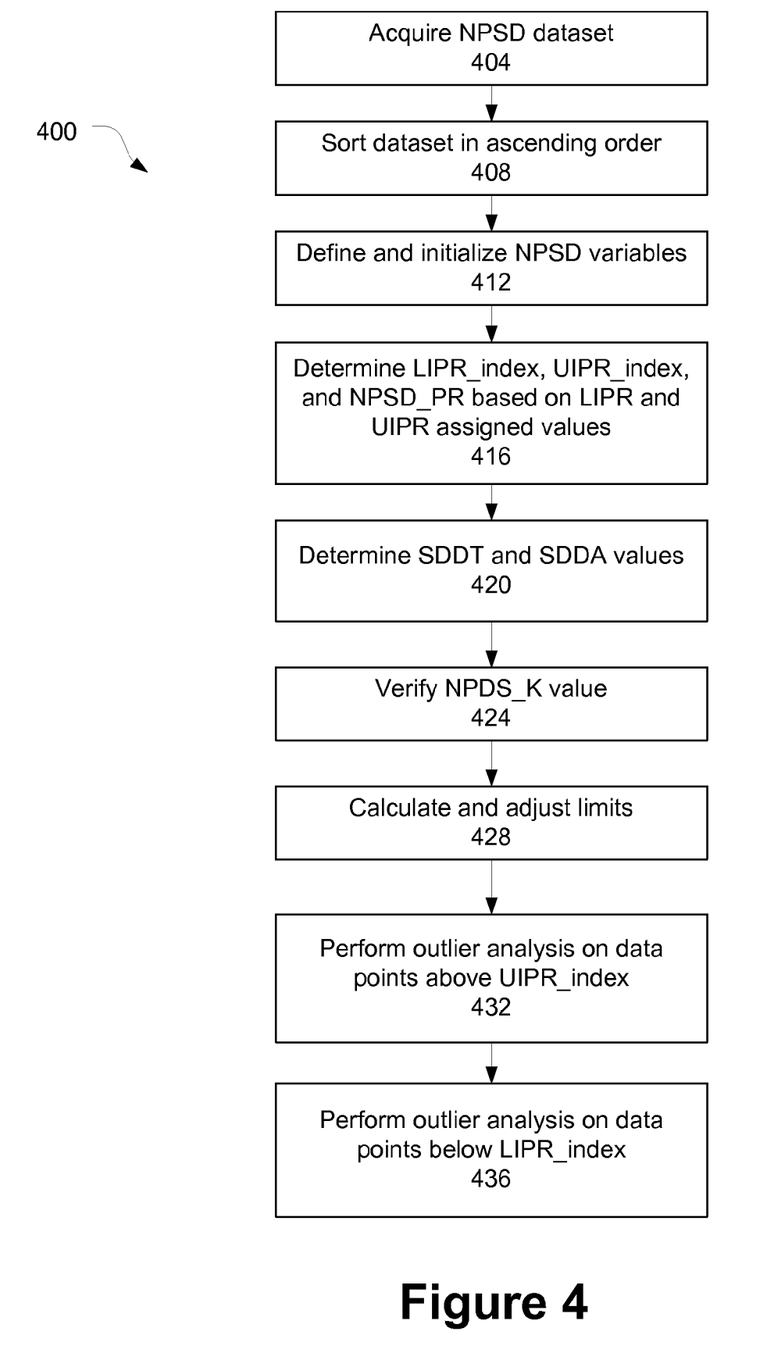
FIG. 4 is a flowchart illustrating a nearest pattern smallest delta (NPSD) procedure to evaluate IDDQ from a device in accordance with various embodiments.

FIG. 4 is a flowchart 400 illustrating an NPSD procedure to evaluate IDDQ from a DUT, e.g., DUT 316, in accordance with various embodiments. The NPSD procedure may be similar to the SDSA procedure described above with some variations noted. The NPSD procedure may have predictive and/or adaptive qualities with the capability to dynamically evaluate and comprehend qualified signatures and differentiate the qualified signatures from outlier signatures. The results of the NPSD procedure may be used to determine whether the DUT 316 passes an IDDQ test.

At block 404, an NPSD dataset may be acquired. The first process involved in acquiring the NPSD dataset may be to receive IDDQ raw data (IDDQ[0, . . . , n−1]), where n indicates the number of vector patterns of the NPSD dataset. The IDDQ measurements may be stored in the sequence that they were measured from the testing platform 308. The NPSD data may then be determined from the IDDQ current measurements with an NPSD iteration algorithm as presented in the following table.

TABLE 8

```
{
npsd_idx=0;
for (IDDQ_Idx=1; IDDQ_idx < n; IDDQ_Idx++) {
  LDelta = abs (IDDQ_array[IDDQ_Idx-1] - IDDQ_array[IDDQ_Idx]);
  RDelta = abs (IDDQ_array[IDDQ_Idx+1] - IDDQ_array[IDDQ_idx]);
  NPSD[npsd_Idx++] = (LDelta <= RDelta) ? LDelta : RDelta;
}
n = npsd_idx; // n now represents number of NPSD data points
```

In this manner, a given vector pattern may be set to be the lesser absolute value of a left IDDQ differential, e.g., LDelta, or a right IDDQ differential, e.g., RDelta. For example, if the absolute value of the difference between IDDQ[2] and IDDQ[1] is less than the absolute value of the difference between IDDQ [2] and IDDQ[3], then NPSD[2] may be set equal to the absolute value of the difference between IDDQ[2] and IDDQ[1].

At block 408, the NPSD dataset may be arranged by order of magnitude, e.g., in ascending order NPSD[0, . . . , n−1].

At block 412, the NPSD variables may be defined and initialized. In some embodiments, the definitions and conditions may be as represented in the following table.

TABLE 9

```
int LIPR=0, UIPR=50; NPSD_PDA=100;
int LIPR_index, UIPR_index, NPSD_FAIL;
double NPSD_K=1, NPSD_LSL=0;
double SDDA=0, SDDT=0, NPSD_DD, NPSD_DL, K_EVAL;
```

In some embodiments, the initial values may be overridden, if needed, from command line inputs or other assignments.

As shown in Table 9, an NPSD procedure may set the LIPR to zero and the UIPR to fifty. Accordingly, outliers in the NPDS dataset, if any, may occur in the upper or last fifty percent of the NPSD sorted dataset and only the data points above the UIPR may need to be processed.

While most of the default values of the NPSD variables may not need to be changed, it may be desirable, in some instances, to change default values of NPSD_K and NPSD_LSL in order to accommodate for unusual test conditions.

One of the reasons why the default values work so well with the NPSD procedure may be due to the ease of controlling vector pattern to vector pattern variance (hereinafter "vector pattern variance") during the vector generation. Most vectors used in IDDQ test are generated automatically using some vector generating tool. However, it is possible to modify the vector such that vector pattern variance in the IDDQ current signature is reduced. This may be done by finding the vectors patterns with similar current signature and putting them together to create one vector label. The lower the vector pattern variance, the more effective the NPSD procedure may be in identifying defects with very low defect currents.

If there is a question of vector coverage in the usage of the above vector pattern variance reduction procedure during vector generation process, it may be possible to create several vector labels, i.e., name tags used in identifying a vector in a test sequence each with very low vector pattern variance, and then joining those labels together to create one large vector having more coverage. The NPSD procedure may still be as effective with the combined vector as long as the final vector was merged in sequential manner.

At block 416, the values of LIPR_index, UIPR_index, and NPSD_PR may be determined based at least in part on the LIPR and UIPR values assigned at block 412. In some embodiments, the determination of these values may be guided by the following equations:

$$\text{LIPR\_index}=(\text{int})((\text{LIPR}*n)/100);\qquad \text{Eq. 14}$$

$$\text{UIPR\_index}=(\text{int})(\text{UIPR}*n)/100);\qquad \text{Eq. 15}$$

$$\text{NPSD\_PR}=\text{UIPR\_index}-\text{LIPR\_index}.\qquad \text{Eq. 16}$$

Given the LIPR of zero, the LIPR_index may also be set to zero for this embodiment.

At block 420, the values of SDDT and SDDA may be determined. In some embodiments, these values may be determined by the algorithm of the following table.

TABLE 10

```
for (index=LIPR=index; index<UIPR_index; index++) {
  SDDT = NPSD[index+1] - NPSD[index] + SDDT; }
switch (SDDT)
  {case 0 : printf ("ERROR\n"); SDDT += 1e-06; }
SDDA = SDDT / UIPR_Index;
```

These initial values of SDDT and SDDA, derived from IPR data points are initially used to determine the first instance of NPSD limit. Subsequent limits as set by the algorithm also use later values of SDDT and SDDA, which would be continuously changing in the algorithm. The SDDT value should not equal zero in this algorithm. Such a value for SDDT may be an indication of improper implementation of this algorithm or bad overall test setup. Line 4 of Table 10 may output an error message in the event of this occurrence, and set SDDT to a very low value.

At block 424, the value of NPSD_K may be verified by determining that it does not lead to false failures. It may do this by checking the first data point above the UIPR data point and automatically adjusting the value of NPSD_K if it identifies, or is close to identifying, the data point as an outlier. This checking may be performed by the algorithm presented in the following table.

TABLE 11

```
NPSD_DL = (SDDT * NPSD_K); K_EVAL = NPSD_K;
NPSD_DD = NPSD[UIPR_index+1] – NPSD[UIPR_index]
if (NPSD_DL > NPSD_DD) {
    while (NPSD_DL > NPSD_DD) {
        K_EVAL=K+EVAL–0.1; NPSD_DL=(SDDT * K_EVAL);
        if (K_EVAL < 0) { K_E-VAL = 0;} }
}
NPSD_K = NPSD_K + K_EVAL;
NPSD_DL = (SDDT * NPSD_K);
K_EVAL = (SDDT * (NPSD_K – 0.25));
if (K_EVAL < NPSD_DD) {
    while (NPSD_DL < NPSD_DD) {
        NPSD_K=NPSD_K+0.25; NPSD_DL=(SDDT* NPSD_K);
    }
    NPSD_K = NPSD_K + 0.25;
}
```

The default value of NPSD_K may be 1, but may automatically adjust as desired. The values of the constants of Table 11, e.g., 0.1 and 0.25, may be changed if desired. If so desired, the constant value 0.1 may be reduced and the constant value 0.25 may be increased.

NPSD_K, which may be similar to SDSA_K described above, may be used to control the limits of outlier behaviors. K_EVAL may be used to evaluate NPSD_K so as to make sure that the NPSD_K value is adequate and does not lead to false failure. NPSD_K default value of 1 may be a good starting point for this variable. If the default value of NPSD_K were to be changed, it may be done so with reference to the variability of the dataset. For example, if there is a lot of variability in the dataset, the NPSD_K value may be incrementally stepped down by 0.25, with the algorithm verifying the value after each increment. If there is very little variability in the dataset, the NPSD_K value may be incrementally stepped up by 0.25, with the algorithm verifying the value after each increment. In some embodiments, increasing NPSD_K much higher than the default value of 1 may increase chances of test escapes while reducing NPSD_K to a number much lower than 1 may increase chances of false failures.

In some embodiments, the constant values 0.1 and 0.25 may be set as floating point constants. Once the values of these constants are set, those values may be used throughout the entire algorithm.

To illustrate the value of dynamically adjusting the value of NPSD_K consider a situation where one product test results behaves differently when ran on two different testing platforms. This could be due to one of the testing platforms having a better power supply noise ratio than the other. If the same value of NPSD_K was used for the two testing platforms, instances of test escapes or false failures may occur depending on which testing platform is being used for the test. Providing the flexibility of a dynamic NPSD_K may allow it to change based on the test data provided by each of the testing platforms, thereby preventing, or at least reducing the chances of either test escapes or false failures. In some embodiments, the initial value of NPSD_K may be based on the testing platform that has the better power supply noise ratio and the NPSD_K may adjust upwards to accommodate cases with more variability on the IDDQ test data due to the testing platform.

The variability of IDDQ test data caused by the three contributory factors, as explained above, may result in an area of overlap between data from defective and non-defective devices. Static or fixed limits may not be effective in accommodating all of the variability in the data. Although the NPSD procedure described herein does not have a fixed limit, it does have a fixed default variable, NPSD_K, initially set in the algorithm that is used to calculate the dynamic limit. Setting the default values improperly could lead to false failures on the areas of the overlap between good and bad dies. Even in some instances when the NPSD_K default value is set properly, false failures may occur due to setup of the testing system 300. Accordingly, verifying and adjusting the NPSD_K value based on the data being analyzed, as described herein, may prevent/reduce the identification of false failures.

The algorithm described in Table 11, may focus on preventing prevent false failures and not test escapes due to remote possibilities of an occurrence of a test escape. Other embodiments may make appropriate modifications to incorporate additional procedures for preventing test escapes.

It may be desired for limits set in the NPSD procedure to have enough buffer between qualified data points and outliers. The NPSD procedure may account for this in the following ways. For the NPSD procedure, the first 50 percent of the data points will be assumed to be qualified data points. It may be desirable for the data point just above the $50^{th}$ percentile data point, the first data point to be checked for outlier behavior, to also be a qualified data point. If the first data point is to fail, then there may not be enough separation in the limit between the qualified data points and outliers. Therefore, to provide sufficient buffer in the limits setting algorithm, the NPSD_K may be temporally reduced by a constant value, e.g., 0.25, and the limits may be recalculated based on the temporary NPSD_K value. If the new temporary limit leads to failure on the first data point evaluated for outlier behavior, the value of NPSD_K may be further increased by the constant value. If temporarily reducing NPSD_K does not lead to failure on the first data point checked, then there may be enough buffer in the algorithm. The specific lines of algorithm of Table 11 that work to accomplish this adjustment of NPSD_K may now be discussed in more detail.

Lines 1 and 2 of Table 11 may set K_EVAL to equal initial NPSD_K set value. These lines may also determine the value of first data point to be evaluated for outlier behavior and the value of the first limit.

Lines 3-6 of Table 11 work to find the smallest value of K_EVAL that would lead to a failure of a temporary dynamic limit calculated. NPSD_DD may be >=0; assume the constant 0.1 to be k, then range of k may be $0 \leq k \leq -0.1$.

Lines 8 and 9 of Table 11 work to buffer the NPSD_K value by adding the new K_EVAL value to NPSD_K. If default value of NPSD_K=1 is used, the separation of outliers and qualified data points, based on the defaults IPR of the evaluated dataset, may not be less than three sigma.

Lines 10-16 of Table 11 ensure that NPSD_K is buffered adequately so as to prevent cases of false failure. This may be done by checking and making sure that the first data above the UIPR data point does not fail when (NPSD_K+0.25) is used in place of NPSD_K. If there is a failure on this analysis, it may be that the NPSD_K is too close to leading to a failure and the buffer from the NPSD_K set value may not be enough. Therefore, the algorithm may adjust the NPSD_K value, which may then be re-evaluated. An NPSD limit may then be calculated based on new NPSD_K value.

At block 428, the initial limits may be recalculated with the verified NPSD_K. This may be done by the following equation.

$$NPSD\_DL = (SDDT * NPSD\_K) + NPSD\_LSL \qquad \text{Eq. 17}$$

NPSD_LSL may be used to set the lowest limits one would like the analysis to accommodate. Therefore, any limit set by the NPSD procedure may not be less than NPSD_LSL.

Although the default value for NPSD_LSL may be 0, there may be cases where a number other than 0 would be desired. For example, consider devices with dual mode current signatures with about 0.06 mA difference between the two signatures. Using the default value of zero for NPSD_LSL may lead to false failures on good devices. So, to accommodate this dual mode signature, NPSD_LSL may be set to 0.06. Both modes on these devices may then be verified to be of true IDDQ states and the small separation may have negligible effect on the setup from capturing true IDDQ defects. Before determining the final value of NPSD_LSL, proper IDDQ characterization and verification across all skew material may be done to determine whether a device exhibits any sign of dual mode current signature in its IDDQ current measurement.

At block 432, an outlier analysis may be performed on data points above the UIPR_index. This outlier analysis may be performed by the algorithm of the following table.

TABLE 12

```
NPSD_FAIL = 0; n = (NPSD_PDA * n) / 100;
for (index = UIPR_index+1; index < n; index++) {
  NPSD_PD = NPSD[index] – NPSD[index–1];
  if (NPSD_DD > NPSD_DL) {
    NPSD_FAIL = 1; ## Indicate failure and output failure information.
  }
  else {
    SDDT = SDDT + NPSD_DD
    SDDA = SDDT / ( index – LIPR_index) ;
    m = index – LIPR_index + 1 ;
    NPSD_DL = (NPSD_K * m * SDDA) + NPSD_LSL;
  }
```

Similar to block 232 of the SDSA procedure described above, the algorithm of Table 12 may sequentially check each data point above the UIPR to determine whether any of the data points are associated with outlier signatures. If a data point is identified as an outlier, the remaining data points above the identified outliers are also identified as outliers. In some embodiments, if the NPSD data set has a predetermined number of outliers identified, the DUT 316 may be determined to have an active IDDQ defect.

The NPSD_PDA of Table 12 may be a variable that creates flexibility in the implementation of IDDQ test setup of the NPSD procedure. It may be used to limit the number of NPSD data points analyzed for outlier identification, which in certain situations may prevent outliers from being included in the final analysis. With NPSD_PDA, NPSD IDDQ may still be as effective under certain test conditions and setups where other methodologies would not fare so well.

Consider, for example, a setup with 100 vector patterns, of which 4 are outlier patterns that cannot be removed in the setup. NPSD_PDA may then be set to 95% in order to neutralize the effect of those 4 outlier patterns. Other setups with similar issues as the example above could also use NPSD_PDA to remove the effect of outlier components of a setup from affecting the final result of the test.

At block 436, an outlier analysis may be performed on data points below the LIPR_index. This analysis may be performed similar to the analysis of block 236, described above, in accordance with some embodiments.

Figure 5:
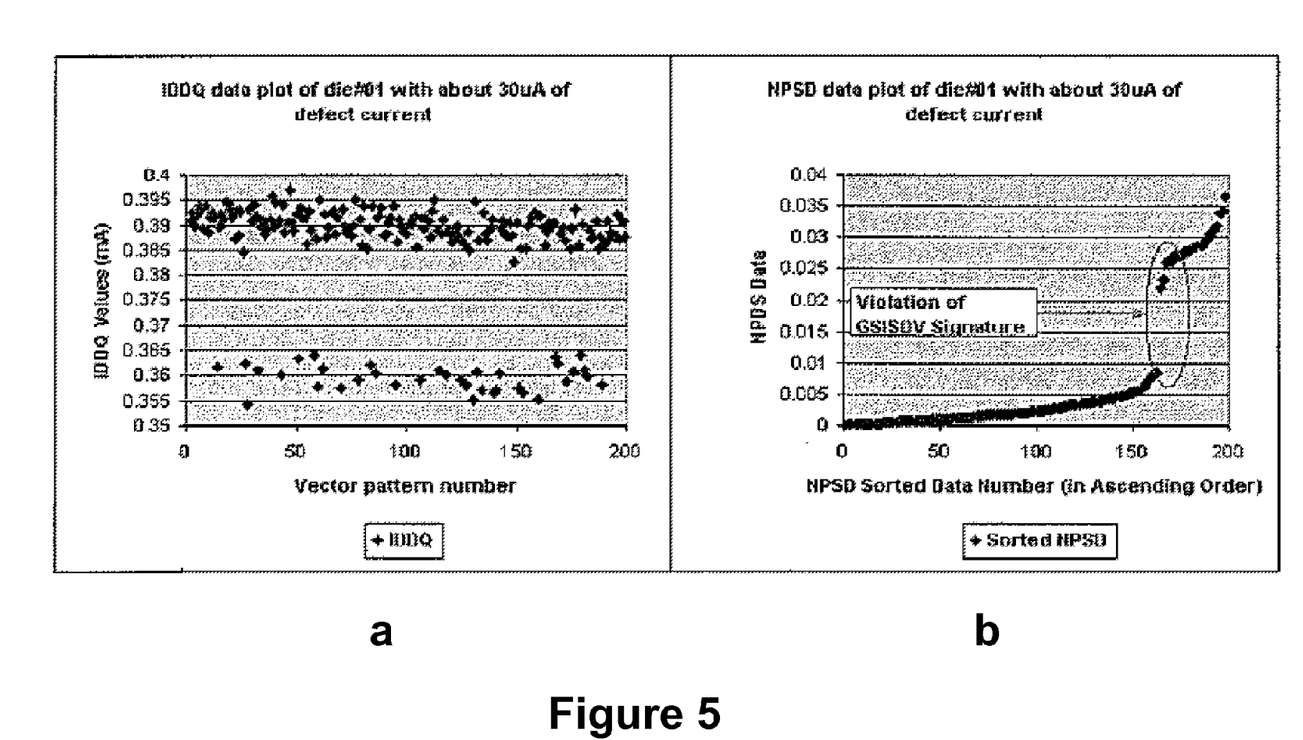
FIGS. 5a and 5b provide graphs of IDDQ data and NPSD data points, respectively, in accordance with some embodiments.

FIGS. 5a and 5b provide graphs of IDDQ data and NPSD data points, respectively, in accordance with some embodiments. The data represented in FIGS. 5a and 5b may be from a DUT with about a 30 microamp (uA) defect current. As can be seen, when the NPSD data points are sorted in ascending order, as shown in FIG. 5b, a violation of gradual and systemic increments of sorted data values (GSISDV) signature may become evident, even at this small value of an active IDDQ defect current. In some embodiments, the NPSD procedure may be capable of detecting single-digit uA defects. Any limitations in detecting active defect current may reside in a resolution of the testing platform 308 and/or stability of the measured IDDQ data.

Figure 6:
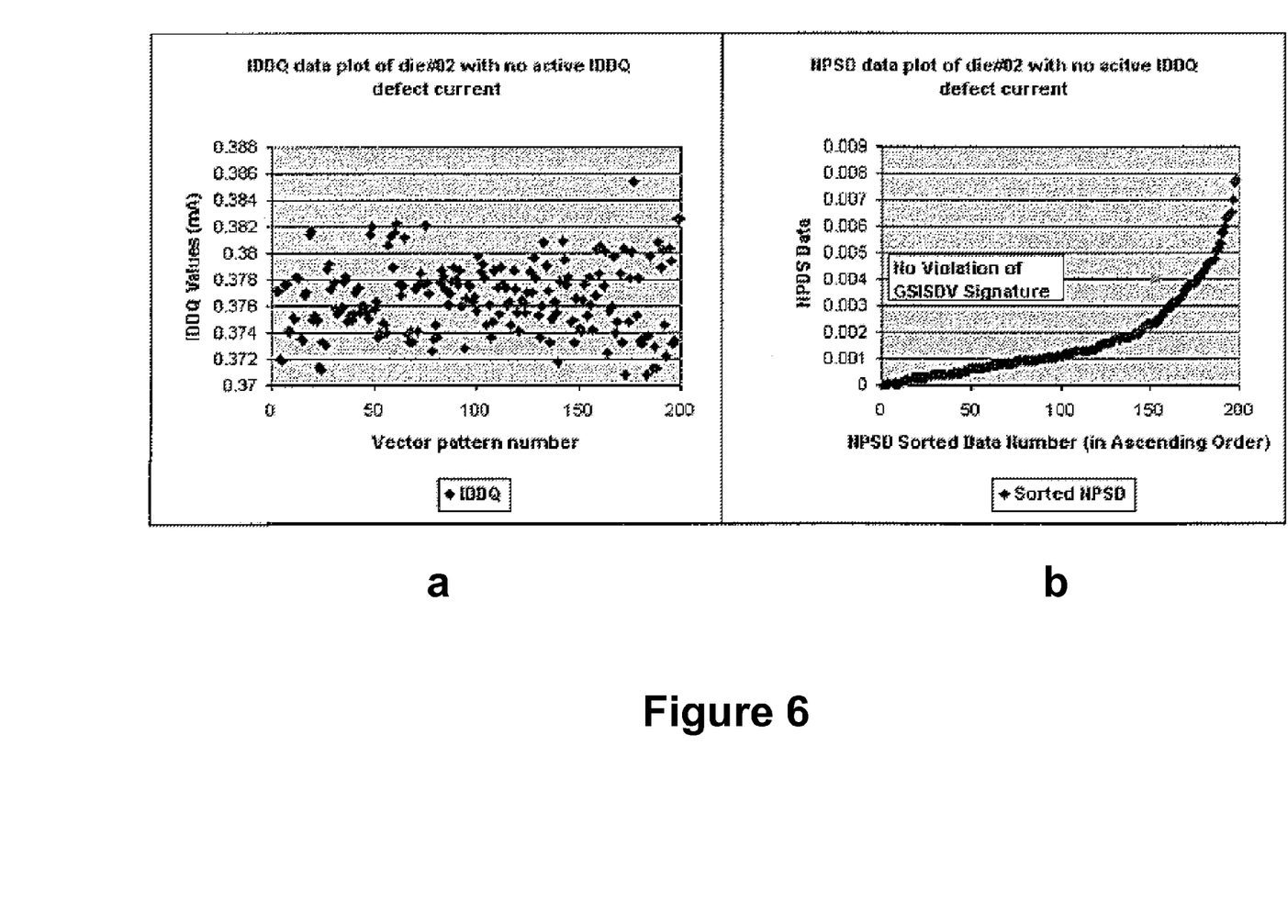
FIGS. 6a and 6b provide additional graphs of IDDQ data and NPSD data points, respectively, in accordance with some embodiments.

FIGS. 6a and 6b provide additional graphs of IDDQ data and NPSD data points, respectively, in accordance with some embodiments. In this embodiment, a DUT may not include a defect and may have a fluctuation or noise range of qualified IDDQ current measurements of about 15 uA. An NPSD procedure would identify any defect current that were to exceed the fluctuation/noise range by a significant degree. However, as can be seen by reference to FIG. 6b, the sorted NPSD data points evidence no violation of a GSISDV signature.

The NPSD procedure described above may be adaptive enough to recognize a GSISDV signature of a variety of different datasets and identify violations of each.

In some embodiments, the concept of the NPSD procedure may also be extended to wafer-level data analysis in order to help reduce the higher level of variance experienced at that level. Reducing wafer-level test data variability may help in making it possible for an outlier identification algorithm to expose outliers that might otherwise escape detection within the wafer-level data population. DSM devices are being processed with even larger wafers at the wafer-level tests. The variation seen at wafer-level processes is now several factors more than what they use to be when smaller wafers were used in the fabrication processes. Trying to identify a defective signature using raw wafer-level test data has become much more difficult as those devices with the defects hide their defective signature in the several layers of variations of the wafer test data. The weights of each data point from each of the dies in the wafer may no longer be equal or similar. This has made it more difficult to identify cases of true outliers in the wafer data population.

In some embodiments, a nearest neighbors smallest delta (NNSD) procedure, a procedure similar to the NPSD procedure discussed above, may be used to give each wafer-level data point an approximately equal amount of weight. Similar to the NPSD procedure, raw test data (in this case raw wafer-level test data) may be processed with the NNSD procedure to create an NNSD wafer-level dataset. The NNSD dataset may then be processed to identify components, within the dataset, that have outlier signatures.

Figure 7:
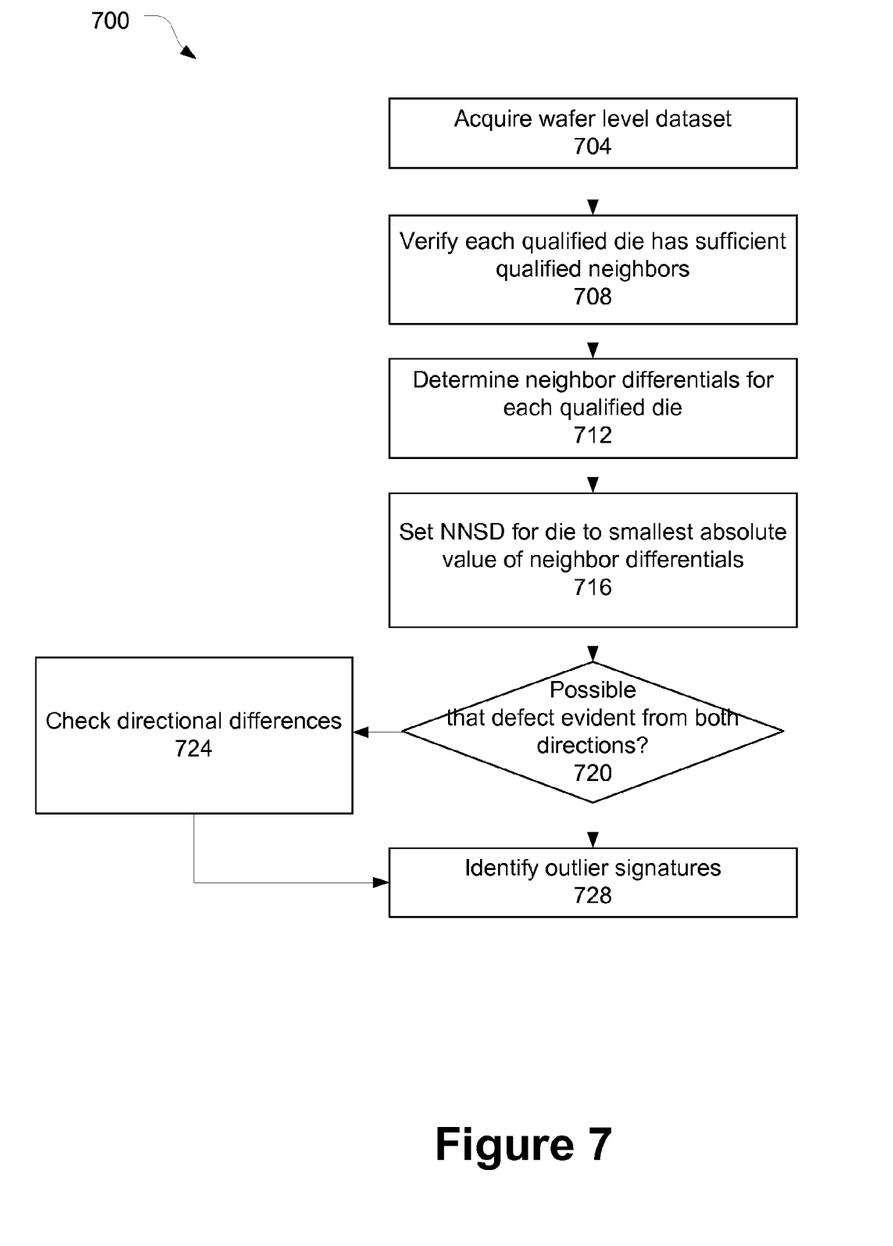
FIG. 7 illustrates a nearest neighbor smallest delta procedure in accordance with various embodiments.
Figure 8:
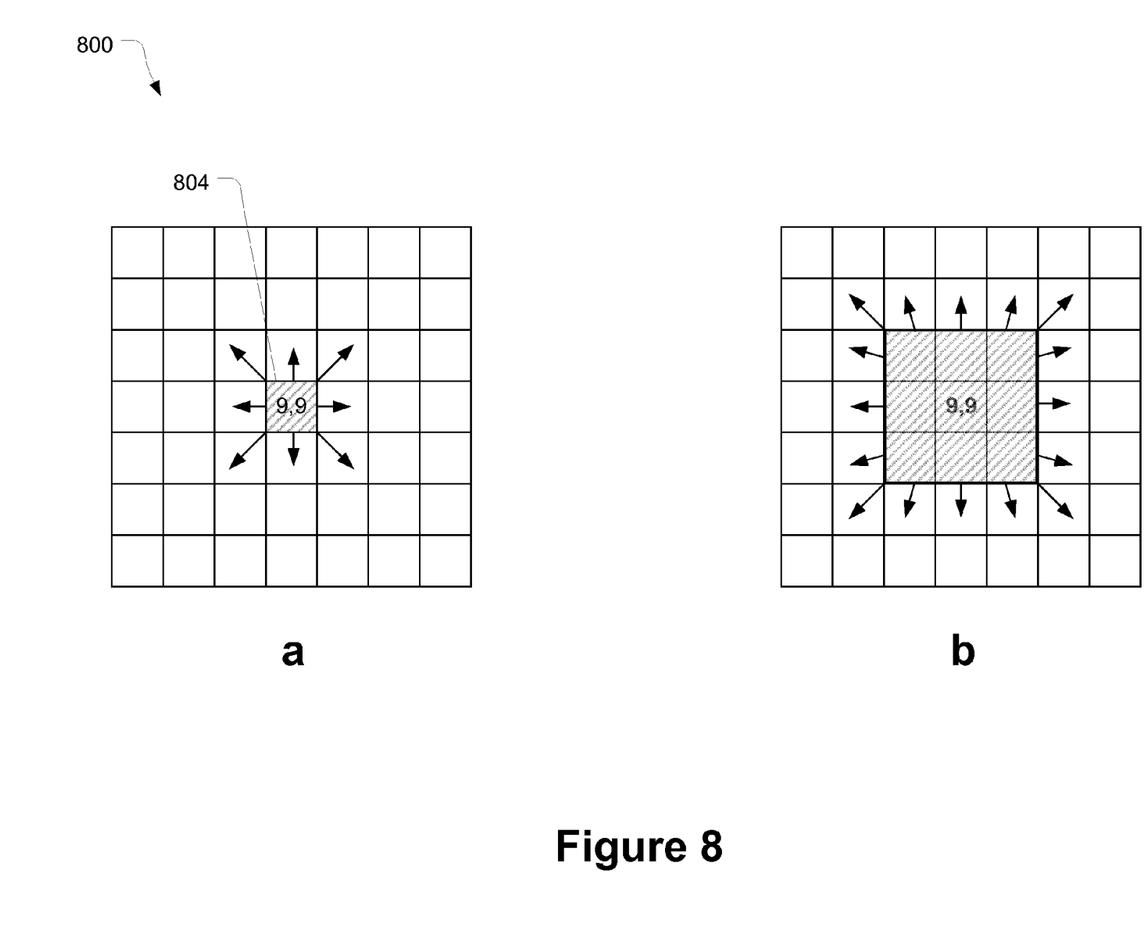
FIG. 8 illustrates a section of a wafer with a number of dies connected together in accordance with various embodiments.

FIG. 7 illustrates an NNSD procedure in accordance with various embodiments. Reference may also be made to FIG. 8, which illustrates a section of a wafer 800 with a number of dies connected together in accordance with various embodiments. Die 804 may be a qualified die at location [9,9].

At block 704, parametric data associated with the qualified dies, i.e., die data, of the wafer may be acquired. Only qualified dies from each wafer may need to be evaluated for outlier signature in the wafer-level data population.

At block 708, it may be verified that each qualified die has sufficient qualified neighbors within a given proximity to proceed with the NNSD procedure. The number of qualified neighbors that is considered sufficient may be determined based on what is considered desirable for an effective analysis. If, e.g., die 804 does not have sufficient qualified neighbors within an immediate proximity, e.g., +/–1 from the location [9,9], as shown in FIG. 8a, the proximity may be extended to +/–2 or more, as shown in FIG. 8b.

At block 712, it may be determined, for each qualified die, an absolute difference between the test die and its qualified neighbors. The absolute value of the difference between a tested die and a qualified neighbor die, e.g., D(test)–D(neighbor), may be referred to as a neighbor differential. Each tested die may have a plurality of neighbor differentials.

At block 716, an NNSD value may be set for each die. The NNSD value for a given die may be set to be the smallest absolute value of its neighbor differentials.

At block 720, it may be determined whether it is possible for a defect in the data analysis to show up in either direction of the data being processed (e.g., above the UIPR or below the LIPR). If so, the sign of the neighbor differential may be checked at block 724. If the sign is negative, then the NNSD value may be reset to the value of the neighbor differential, which may be the negative of the originally selected absolute value. If the sign is positive, the NNSD value may be kept with its orientation. The motivation for this phase may be described below.

It may be that some defects signatures, e.g., IDDQ passive defects, would only show up as an elevation in current signature. These may be unidirectional in their behavior. Thus, passive IDDQ defects and defects with similar signature may only show up in the upper section of the sorted dataset if the SDSA procedure is used and there is no need to check if there would have been cases of negative value in the NPSD IDDQ iteration.

However, defect signatures that are bidirectional in their behavior may show up in either the lower or upper section of a sorted NNSD dataset. An example of a defect signature with bidirectional characteristics is a passive IDDQ defect signature. Passive IDDQ defects, by definition, are defects that are common to all of the vector patterns in a vector label. Passive IDDQ defects are usually caused when there is a short between a power and ground inside the DUT. In those cases, the defective signature during IDDQ current measurement is an elevation in the IDDQ current measurement. However, there some cases where passive IDDQ defects are caused by a short between different power supplies inside the DUT. For these cases, the defective signature could become a drop in the IDDQ current measurement instead of an increase of IDDQ current measurement. Therefore, the defect signature of a passive IDDQ defect is bidirectional in its characteristics, that is, it could exhibit itself as an increase in current measurement or a decrease in the current measurement depending on what the defect type is in the DUT.

If it was determined that the defective signature has bidirectional characteristics, then there is need to check if the final value of NNSD would have been negative or positive and if found to be negative, the NNSD may be multiplied by −1 to indicate true direction of defect.

At block 728, the final NNSD dataset may be processed with SDSA procedure in order to determine if any of the NNSD have outlier signatures. In some embodiments, other outlier identification procedures may be used in place of the SDSA procedure.

While NPSD may be used to detect active IDDQ defects, e.g., defects that affect some or most, but not all, of the vector patterns in a vector label, NNSD may be used to detect passive IDDQ defects, e.g., defects that are common to all of the vector patterns in a vector label.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A system comprising:
    a testing platform having an interface communicatively coupled to a device interconnect, wherein the device interconnect is configured to be communicatively coupled to a device; and
    a control platform communicatively coupled to the interface, wherein the control platform is configured to
        determine a percentile range of a dataset that has been sorted,
        determine a signature of the percentile range,
        determine a signature of a plurality of vector patterns, wherein the plurality of vector patterns includes a first test vector pattern that is outside of the percentile range,
        compare the signature of the percentile range to the signature of the plurality of vector patterns, and
        based at least in part on comparing the signature of the percentile range to the signature of the plurality of vector patterns, identify the first test vector pattern as one of (i) a qualified vector pattern or (ii) a non-qualified vector pattern, wherein a qualified vector pattern represents a measurement or observation that is deemed to be properly associated with remaining qualified vector patterns of the dataset.

2. The system of claim 1, wherein the control platform is further configured to:
    receive a plurality of quiescent current (IDDQ) measurements from the testing platform, wherein the plurality of IDDQ measurements relate to a device under test;
    based at least in part on the plurality of IDDQ measurements, acquire the dataset; and
    sort the dataset to generate the dataset that has been sorted.

3. The system of claim 2, wherein the control platform is further configured to:
    set each vector pattern of the dataset equal to a lesser absolute value of (i) a left IDDQ differential and (ii) a right IDDQ differential.

4. The system of claim 2, wherein the dataset is a univariate dataset.

5. The system of claim 2, wherein the control platform is further configured to:
    sort the dataset by order of magnitude.

6. The system of claim 1, wherein the control platform is further configured to:
    determine a nearest pattern smallest delta value (NPSD_K); and
    based at least in part on the nearest pattern smallest delta constant, identify the first test vector pattern as one of (i) a qualified vector pattern or (ii) a non-qualified vector pattern.

7. The system of claim 1, wherein the control platform is further configured to:
    re-determine the percentile range of the dataset that has been sorted to include the first test vector pattern; and
    re-determine the signature of the percentile range.

8. The system of claim 7, wherein the control platform is further configured to:
    determine a signature of a second plurality of vector patterns, wherein the second plurality of vector patterns includes a second test vector pattern that is outside of the re-determined percentile range;

compare the re-determined signature to the signature of the second plurality of vector patterns; and based at least in part on comparing the re-determined signature to the signature of the second plurality of vector patterns, identify the second test vector pattern as one of (i) a qualified vector pattern or (ii) a non-qualified vector pattern.

9. The system of claim 1, wherein the control platform is further configured to:
   determine a nearest pattern smallest delta value (NPSD_K); and
   identify a non-qualified vector pattern based at least in part on the NPSD_K.

10. The system of claim 9, wherein the control platform is further configured to:
    determine the NPSD_K based at least in part on the plurality of vector patterns.

11. The system of claim 1, wherein the control platform is further configured to:
    generate a dataset by, based at least in part on a plurality of quiescent current (IDDQ) measurements, acquiring a dataset, wherein the IDDQ measurements relate to a device under test; and
    sorting the dataset to generate the dataset that has been sorted.

12. The system of claim 11, wherein the control platform is configured to acquire the dataset by setting each vector pattern of the sorted dataset equal to a lesser absolute value of (i) a left IDDQ differential and (ii) a right IDDQ differential.

13. The system of claim 11, wherein the dataset is a univariate dataset.

14. The system of claim 11, wherein the control platform is configured to sort the dataset by order of magnitude.

* * * * *